United States Patent [19]
Hamilton

[11] Patent Number: 5,911,897
[45] Date of Patent: *Jun. 15, 1999

[54] TEMPERATURE CONTROL FOR HIGH POWER BURN-IN FOR INTEGRATED CIRCUITS

[75] Inventor: Harold E. Hamilton, Minneapolis, Minn.

[73] Assignee: Micro Control Company, Fridley, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/782,066

[22] Filed: Jan. 13, 1997

[51] Int. Cl.$^6$ ...................................... H05B 1/02
[52] U.S. Cl. .................. 219/497; 219/209; 219/494; 324/755; 324/760
[58] Field of Search ................... 219/494, 209, 219/210, 497, 501, 505; 324/537, 755, 760; 437/248

[56] References Cited

U.S. PATENT DOCUMENTS

| | | | |
|---|---|---|---|
| 4,900,948 | 2/1990 | Hamilton | 307/149 |
| 5,126,656 | 6/1992 | Jones | 324/158 F |
| 5,164,661 | 11/1992 | Jones | 324/158 F |
| 5,233,161 | 8/1993 | Farwell et al. | 219/209 |
| 5,315,240 | 5/1994 | Jones | 324/158 F |
| 5,329,093 | 7/1994 | Okano | 219/209 |
| 5,420,521 | 5/1995 | Jones | 324/760 |
| 5,515,910 | 5/1996 | Hamilton et al. | 165/30 |
| 5,571,027 | 11/1996 | Roebuck et al. | 439/264 |
| 5,682,064 | 10/1997 | Atkins et al. | 257/701 |
| 5,705,933 | 1/1998 | Lim et al. | 324/755 |

*Primary Examiner*—Mark H. Paschall
*Attorney, Agent, or Firm*—Westman, Champlin & Kelly, P.A.

[57] ABSTRACT

A temperature control system for high power burn-in of integrated circuit chips which includes an individual heat sink at each of the integrated circuit chips to dissipate heat generated by the integrated circuit. A heater for each chip is provided and is temperature controlled so that heat may be added by the heater as a function of the heat generated by the integrated circuit chip. A temperature sensor is provided in close thermal contact with the integrated circuit chip to sense the temperature of the integrated circuit chip. A closed loop temperature controller is used to vary the amount of current provided to the heater to maintain a desired range of temperature. Thermal contact between the temperature sensor and the integrated circuit chips is insured by utilizing a spring to urge the sensor toward the integrated circuit chip.

7 Claims, 2 Drawing Sheets

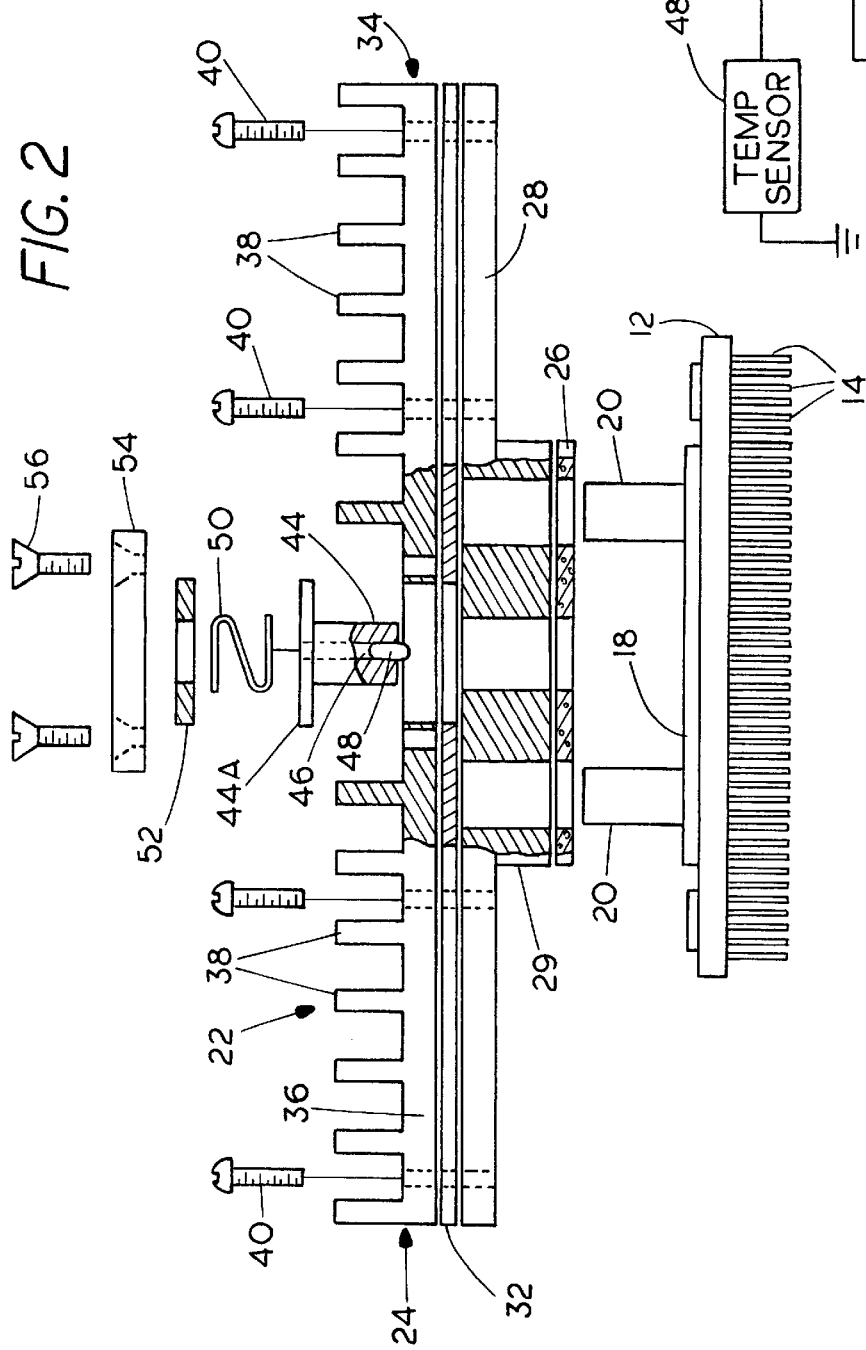
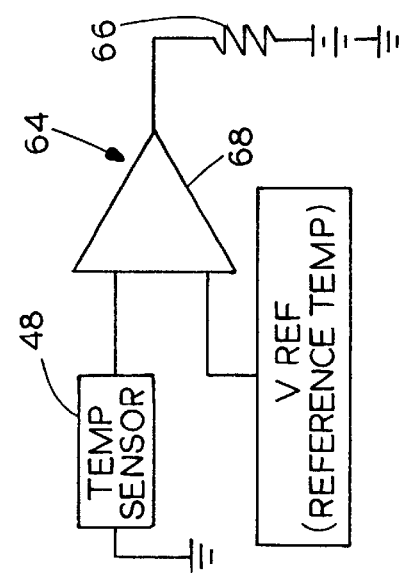

TEMPERATURE CONTROL FOR HIGH POWER BURN-IN FOR INTEGRATED CIRCUITS

BACKGROUND OF THE INVENTION

The present invention relates to controlling the temperature of an integrated circuit chip that is undergoing a high power burn-in test by using a heat sink that dissipates heat generated by the integrated circuit, in combination with a controlled heater to add heat. A sensor in contact with the integrated circuit chip is used to provide a signal to control the heater to maintain the integrated circuit chip at a desired temperature range.

The procedure of burn-in of integrated circuits is well known, and various structures are provided for such burn-in. U.S. Pat. No. 4,900,948 shows an apparatus for providing burn-in of integrated circuits on burn-in boards. A thermal control system for controlling the temperatures of high power semiconductor devices that are being burned in is shown in U.S. Pat. No. 5,515,910. This device uses a liquid cooling.

In some instances, it is desirable to measure and control the temperature of each semiconductor device. U.S. Pat. No. 5,164,661 shows a device that uses two temperature sensors, one of which senses the temperature of the heat exchange device and the other senses the temperature of the integrated circuit under test.

Various other test systems for component testings are well known, including life tests in burn-in chambers. The process of burning in a semiconductor chip typically consists of applying a load to the electronic components on the integrated circuit chip being tested at elevated temperatures. This allows identification of weak or faulty components for insuring quality control for reliable ultimate use of such integrated circuits, such as in a computer system.

SUMMARY OF THE INVENTION

The present invention relates to a temperature control system for high power burn-in testing that permits maintaining an integrated circuit chip under test at a substantially uniform temperature. Specifically, the integrated circuit chip under test is plugged into a burn-in socket on a mother board in a test oven. The integrated circuit chip is placed into heat conducting relationship to a plate heater, which in turn is in thermally conductive relationship to a heat sink. The integrated circuit temperature is sensed with a suitable temperature sensor, such as a thermistor, which is held in intimate contact with the integrated circuit. The signal from the thermistor controls a power source to the heater so that when the temperature is below a certain level, the heater will be energized to provide heat to maintain the integrated circuit chip at a desired temperature profile. The heat sink will dissipate heat from both the heater and the integrated circuit chip.

The temperature sensor is in a housing that is spring loaded to hold the temperature sensor against the integrated circuit chip to insure that it is an intimate, heat conducting relationship to the integrated circuit chip.

The present device is quite easily controlled to maintain the temperature of individual integrated circuit chips in a burn-in system within a desired range.

BRIEF DESCRIPTION OF THE DRAWINGS

FIG. 2 is an exploded view of the integrated circuit chip and temperature control system of FIG. 1, rotated 90° for clarity; and FIG. 3 is a schematic representation of a temperature controller used with the present invention.

DETAILED DESCRIPTION OF THE PREFERRED EMBODIMENTS

Figure 1:
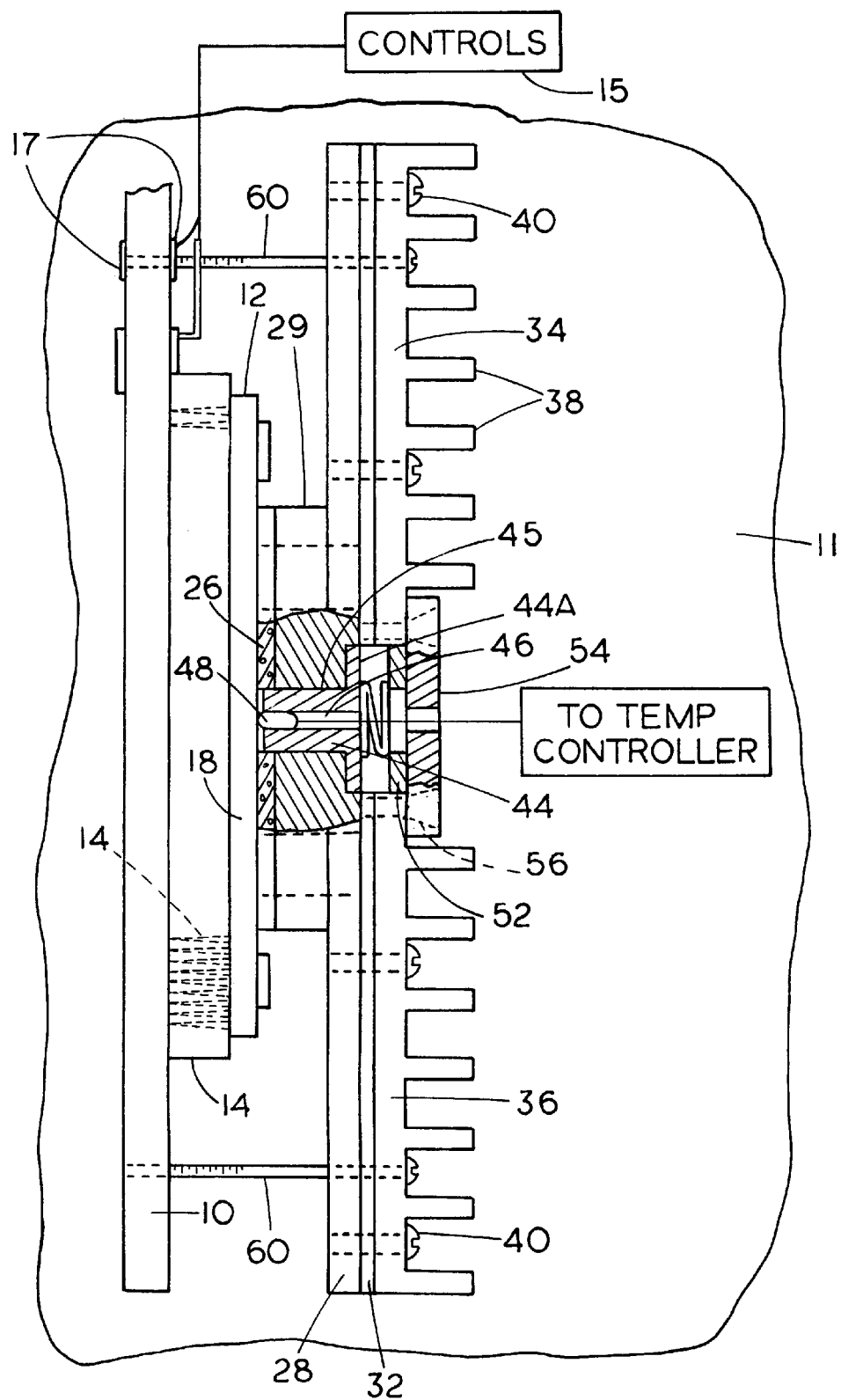
FIG. 1 is a partial sectional view of a burn-in board supporting an integrated circuit chip in a burn-in board socket for test, and having a temperature control system made according to the present invention installed thereon.

A mother board or burn-in board for burning in of integrated circuits is illustrated generally at 10, and is of selected size to fit within a burn-in oven 11. The mother board 10 mounts a plurality of chip sockets 16 which are connected to the necessary controls 15 through edge connectors 17 for powering components on an integrated circuit chip 12 which is being tested. The integrated circuit chip 12 has a number of pins, some of which are shown schematically at 14. The pins plug into one of the burn-in board sockets 16 that are attached to the mother board 10. Each socket 16 is positioned on the board 10 in a desired arrangement with several other sockets, so that a large number of integrated circuits can be tested at one time. The details of construction of the burn-in board, the mother board and the mother board sockets 16 are shown in prior patents and are not shown in great detail. However, it is to be understood that each of the circuits on the integrated circuit chip 12 will be connected for powering and cycling the components as desired for the test involved.

As can be seen in FIGS. 1 and 2, the integrated circuit chip 12 shown has a layer 18 and this chip has posts 20 thereon which may be for a heat sink in use. A thermal control assembly 22 is in thermal contact with the layer 18, and thus in close thermal contact with the integrated circuit chip 14. Clearance is provided for the posts 20. A heat sink assembly 24 as shown includes a heat conductive, resilient foam layer 28 positioned to directly engage the layer 18 to provide for thermal transfer from the integrated circuit chip 12 to a base plate 28, which has an internal a boss portion 29 backing the thermal foam 26. The base plate 28 is made of high heat conducting material such as a metal. A flat surface resistance heater plate 32, or other type of electrical heater is positioned against the base plate 28 across the surface that faces outwardly from the integrated circuit chip 14. Thus there is quite a wide surface area for heat transfer between the base plate and the heater. On the opposite side of the heater plate 32 there is a heat sink 34, that has a lower plate member 36 and a number of fins 38 to dissipate a substantial amount of heat from both the heater plate 32 and the integrated circuit chip 12.

As shown, the heater plate 32 is clamped to the base plate 28 and to the heat sink 34 by screws 40 which thread into the base plate to clamp the heater tightly against both the heat sink and the base plate. These components form the heat sink assembly 24.

A temperature sensor housing 44 is positioned to fit into a central opening 45 formed in the heat sink 34, heater 32, base plate 28 and thermal foam layer 26. The sensor housing 44 is made of material having low thermal conductivity (a heat insulator) and has an internal passageway 46 which at its lower end mounts a thermistor or other temperature sensor 48. The temperature sensor 48 protrudes slightly outwardly from the end of housing 44, so that when the housing is positioned in the opening 45 and under spring load, the sensor will engage the surface of plate 18 so that the temperature sensor is in good thermal contact with the integrated circuit chip itself and in particular the heat conducting layer 18. The temperature sensor housing 44 is urged toward the base plate with a spring 50 backed with a washer 52 and a cap 54 that is held on the heat sink 34 with suitable countersunk screws 56. A head 44A on the temperature sensor housing seats in a recess in the base plate under load from spring 50.

Some integrated circuit chips have a temperature sensor integral therewith. The integral temperature sensor can be used for control on the temperature instead of sensor 48.

The temperature control assembly 22 is clamped down onto the integrated circuit chip, to compress the foam layer and hold the base plate 28 and the entire thermal control assembly in good thermal contact with the integrated circuit chip 12 through the use of screws 60 which pass through apertures in the heat sink, the heater and the base plate, and then can thread into the mother board 10 to clamp the thermal control assembly tightly onto the integrated circuit chip. When the screws 60 are tightened, the thermistor or other sensor indicated at 48 is urged into intimate contact with the plate 18 of the integrated circuit chip 12. The spring 50 will yield slightly so that the temperature sensor or thermistor 48 is loaded against the layer 18 under a spring load. The resilient heat conductive foam layer 26 will compress to conform to the surface of the integrated circuit chip and the deposited components.

When the countersunk screws 56 are tightened, the spring 50 will be urged against the head portion 44A of the sensor housing, so that the housing 44 is held in position under spring pressure.

In order to control the amount of heat that is being provided by the heater, and thus control the temperature of the integrated circuit chip 12, a simplified schematic for a controller circuit is shown in FIG. 3 at 64. The amount of current provided to the heater represented schematically at 66 is controlled by a temperature controller operation amplifier 68 which essentially is a comparator having one input at a reference voltage level, which can be adjustable. The reference represents the reference or desired temperature. A voltage signal based on the signal from temperature sensor 48 (or an integral sensor) is connected to the other input of the amplifier 68. Differentials between the two inputs will cause the amplifier 68 to vary the output to control the current in the heater 66. Either a pulsed current or an analog current can be provided to the heater.

The heater plate 32 may have two separate resistances connected in parallel, but they are represented schematically in FIG. 3.

Preferably the temperature controller 64 is mounted on the mother board 10, or quite close to the heater that it is controlling. There is a separate temperature controller for each of the integrated circuit chips being tested. One voltage reference source, however, can be used for several different temperature controllers.

If desired, a separate board can be used for mounting the temperature controllers, and they can be connected to the burn-in board or mother board 10 during use.

In operation, when the integrated circuit chip is powered through socket 16, the heat sink 34 will remove most of the heat from the integrated circuit 12. In order to maintain a substantially constant temperature, heat is added by the heater 32, and the amount of heat that is added is dependent on the heat generated by the integrated circuit chip. This will vary from one integrated circuit to another. The amount of heat added by the heater may also vary because of variable heat loss from one heat sink to another. Thus, the individual controller for each of the temperature control assemblies is important.

The temperature sensor makes contact with the integrated circuit chip and senses its temperature. A closed loop temperature controller as shown in FIG. 3 is used to control the heat provided by the heater.

The spring 50 insures good thermal contact between the temperature sensor 48 and the integrated circuit layer 18.

The thermal control unit is held in place by clamping the thermal control assembly 22 relative to the mother board. The thermal foam layer is not always used, but provides some resiliency for reducing thermal impedance, so that there is good thermal contact.

While one type of fastener (screw 60) is shown for holding the thermal control assembly 22 in position on the integrated circuit 14, other types of fasteners can be used as desired.

The size of the heat sink 34 can be varied to accommodate the amount of power that needs to be dissipated by the integrated circuit chip, and the heater size also can be varied as desired.

The integrated circuit chip is called a "device under test" and may be abbreviated as DUT for convenience.

Although the present invention has been described with reference to preferred embodiments, workers skilled in the art will recognize that changes may be made in form and detail without departing from the spirit and scope of the invention.

What is claimed is:

1. A system for controlling the temperature of an integrated circuit chip during a burn-in test for an integrated circuit on the chip, including a circuit chip mounted on a burn-in board, a thermal control assembly including a heat conducting base a heater supported in heat conducting relationship to the base, and a heat sink for a dissipating heat supported in thermal conducting relationship to the heater and holding the heater in position against the base, the base having a bore therethrough;

a temperature sensor housing of low thermal conductivity mounted in the bore of the base, the temperature sensor housing having a bore therein;

a single temperature sensor mounted in the bore of the temperature sensor housing and in thermal contact with the integrated circuit chip; and a controller connected to the single temperature sensor to regulate the heat dissipated by the heater in response to signals from the single temperature sensor.

2. The system of claim 1, and a spring member to urge the temperature sensor housing in a direction to move the temperature sensor against the integrated circuit chip thermal control assembly is mounted on the integrated circuit chip.

3. The system of claim 1, wherein the integrated circuit chip is mountable in a socket on a burn-in board, and fasteners extending through the heat sink, heater and base for urging the thermal control assembly against the integrated circuit chip in a socket by fastening the fasteners relative to the burn-in board.

4. The system of claim 1, wherein the thermal control assembly includes a layer of conductive thermal foam positioned between the integrated circuit chip and the base.

5. The system of claim 1 wherein the controller comprises an amplifier controlling current to the heater as a function of differentials in voltage between a voltage signal from the temperature sensor and a reference.

6. A system for controlling the temperature of an integrated circuit chip during a burn-in test for an integrated circuit on the chip, including a circuit chip mounted on a burn-in board, a thermal control assembly including a heat conducting base, a boss in a center portion of the base plate, a heater supported in heat conducting relationship to the base on a side thereof opposite the boss for heating the integrated circuit chip, and a heat sink for a dissipating heat supported in thermal conducting relationship to the heater and holding the heater against the base, and a single temperature sensor mounted relative to the base plate and engaging a circuit chip on a board, and a compartment having an input connected to receive a temperature dependent voltage signal from the temperature sensor and having an output providing current to the heater area compared function of the difference between the temperature dependent voltage and a reference voltage at a second input of the comparator.

7. A system for controlling the temperature of an integrated circuit chip during a burn-in test for an integrated circuit on the chip, including a circuit chip mounted on a burn-in board, a heat conducting base plate, including a heat conducting boss in center portions thereof, a heater supported in heat conducting relationship to the base plate on a side thereof opposite the boss for heating the integrated circuit chip, a heat sink for dissipating heat supported in thermal conducting relationship to the heater and clamped to hold the heater against the base plate, a bore through the base plate and boss having a through bore, a temperature sensor housing mounted in the bore, said temperature sensor housing having a second bore therein, and a temperature sensor mounted in the second bore and extending to be held in thermal contact with the integrated circuit chip, and a controller to regulate the heat dissipated by the heater in response to signals from the single temperature sensor as a function of the differential between a voltage signal from the temperature sensor and a reference voltage.

* * * * *